(12) United States Patent
Benedict et al.

(10) Patent No.: US 6,584,820 B1
(45) Date of Patent: Jul. 1, 2003

(54) SURFACE ENHANCED METAL PRESS PLATES FOR USE IN MANUFACTURE OF LAMINATES AND MULTILAYER MATERIALS AND METHOD OF MAKING SAME

(75) Inventors: Scott M. Benedict, Penacook, NH (US); Edward Carignan, Los Gatos, CA (US); Mark Ferman, Franklin, NH (US); Matthew Lampron, Hopkinton, NH (US)

(73) Assignee: Polyclad Laminates, Inc., Franklin, NH (US)

( * ) Notice: Subject to any disclaimer, the term of this patent is extended or adjusted under 35 U.S.C. 154(b) by 269 days.

(21) Appl. No.: 09/666,431

(22) Filed: Sep. 21, 2000

Related U.S. Application Data
(60) Provisional application No. 60/155,747, filed on Sep. 23, 1999.

(51) Int. Cl.[7] ............................... B24C 1/10; B24B 1/00
(52) U.S. Cl. ................................. 72/53; 451/38; 451/75
(58) Field of Search ............................. 72/53; 451/38, 451/39, 75

(56) References Cited

U.S. PATENT DOCUMENTS

| | | | | |
|---|---|---|---|---|
| 2,448,316 A | * | 8/1948 | Lesavoy ..................... | 451/38 |
| 3,073,022 A | * | 1/1963 | Bush et al. .................. | 72/53 |
| 3,545,996 A | * | 12/1970 | Duncan ....................... | 451/38 |
| 3,643,379 A | * | 2/1972 | Testolin ...................... | 451/74 |
| 3,763,602 A | * | 10/1973 | Boettcher .................... | 451/38 |
| 3,787,191 A | * | 1/1974 | Duncan ....................... | 72/58 |
| 4,076,566 A | * | 2/1978 | Power ......................... | 451/38 |
| 5,160,567 A | | 11/1992 | Konicek et al. ............. | 101/127.1 |
| 5,244,375 A | | 9/1993 | Laurence et al. ........... | 101/127.1 |
| 5,286,330 A | | 2/1994 | Katoh et al. ................ | 101/127.1 |
| 5,306,531 A | | 4/1994 | Laurence et al. ........... | 101/127.1 |
| 5,526,664 A | | 6/1996 | Vetter ......................... | 101/127.1 |
| 5,596,912 A | | 1/1997 | Laurence et al. ........... | 101/127.1 |
| 5,698,053 A | | 12/1997 | Carroll et al. .............. | 101/127.1 |
| 5,704,239 A | * | 1/1998 | Beals et al. ................. | 72/53 |
| 5,723,221 A | | 3/1998 | Brooker et al. ............. | 101/127.1 |
| 5,785,579 A | * | 7/1998 | Grondin ...................... | 451/38 |

FOREIGN PATENT DOCUMENTS

WO     WO94/21097     9/1994

\* cited by examiner

*Primary Examiner*—David Jones
(74) *Attorney, Agent, or Firm*—Mintz, Levin, Cohn, Ferris, Glovsky and Popeo, P.C.

(57) ABSTRACT

The invention provides a method for producing a metal plate with an enhanced surface. More particularly, the method of the invention produces a metal press plate with a roughened matte surface having a substantially uniform and raised surface topography for use in the manufacture of laminated and multilayer materials used to fabricate circuit boards and other electronic assemblies. The method of the invention also cleans and reprocesses the roughened matte surface of the metal press plate after use in laminate and multilayer materials production to reestablish the substantially uniform and raised surface topography. The invention also provides a metal press plate produced according to the method of the invention.

32 Claims, 11 Drawing Sheets

SURFACE ENHANCED METAL PRESS PLATES FOR USE IN MANUFACTURE OF LAMINATES AND MULTILAYER MATERIALS AND METHOD OF MAKING SAME

CLAIM OF PRIORITY

This application claims priority under 35 U.S.C. § 119(e) to U.S. provisional patent application Serial No. 60/155,747, filed on Sep. 23, 1999, incorporated herein by reference.

FIELD OF THE INVENTION

The invention provides a method for producing a roughened matte surface on a metal press plate used in the manufacture of laminates and multi layer materials used to fabricate circuit boards and electronic assemblies. The invention also provides a metal press plate produced according to the method of the invention.

BACKGROUND OF THE INVENTION

Materials used to fabricate circuit boards include flat laminate and multilayer stock materials, which typically include several sheets of material, such as, for instance, fiberglass cloth that is impregnated with an epoxy and sandwiched between sheets of metal foil, typically copper foil. During pressing phases of laminate manufacture, metal foil is bonded by heat and pressure to a predetermined number of layers of stock material referred to as a prepreg. One or both sides of the prepreg receive metal foil by pressing the prepeg and metal foil between a pair of metal press plates in a vacuum press. A metal foiled pressed unit is produced which is subsequently etched with a polymeric photosensitive photo resist material to form electrically conductive lines in the metal foiled unit. Such conductive lines are used to create electrical circuits in surfaces of laminate materials. Small flaws and imperfections in and on surfaces of metal foils can interfere with the formation of such conductive lines and, therefore, are highly undesirable and critical to the quality and yield of laminate production.

Contaminants adhered to surfaces of metal press plates are a prime source of flaws and imperfections in metal foiled laminate surfaces, as well as small and fine scratches and burrs inherent in metal press plate surfaces. Metal press plate surface contamination and inherent imperfections impart unwanted anomalies to surfaces of metal foiled laminates, such as impressions, dents, pits and other blemishes, which interfere with circuit formation and detract from the quality of laminates produced. A single pair of metal press plates is typically used to press metal foil to several prepregs in one production run. Any contaminants and inherent surface imperfections present on the metal press plate surfaces will be transferred from one foiled laminate to another, reproducing flaws and imperfections in each subsequently pressed prepreg and essentially reducing the quality of laminates and overall manufacturing yield of a production run.

Methods to control the contamination of metal press plate surfaces include operator and clean room protocols and techniques to reduce the level of epoxy resin particles, epoxy resin dust, fibers and other contaminants produced during and as a consequence of laminate production. Airborne epoxy resin dust and hardened epoxy particles are particularly difficult to eliminate or substantially reduce from surfaces of metal press plates. Various cleaning methods involve mechanical scrubbing, rinsing and drying of metal plates using mechanical scrubbing equipment such as that manufactured by Curtin-Hebert Co., Inc. of New York and Wesero Gmbh of Germany. However, such prior art cleaning methods are ineffective in substantially removing or reducing the level of surface contaminants and have no ability to remove scratches, burrs and other surface flaws and imperfections such that the effects of metal press plate contamination on manufacturing yield are substantially mitigated. In addition, cleaning methods require considerable production downtime for preventive maintenance and cleaning, which further reduces the productivity of laminate manufacture.

Prior art metal press plates supplied to laminate manufacturers include stainless steel or aluminum press plates with surface finishes of a relatively high polish to achieve a shiny and smooth press plate surface. The logic of the electronics industries, and particularly of manufacturers of circuit boards and other electronic assemblers, is that highly polished metal press plates are necessary for production of metal foiled laminates, since surface contaminates are less likely to adhere to highly polished metal press plate surfaces, and, thus, achieve flawless metal foil surfaces. In addition, the presumption that highly polished metal press plate surfaces are easily cleaned to remove surface contaminants is also widely held throughout the electronics industries. In fact, highly polished metal press plates have been found to produce a significant level of surface anomalies in metal foiled laminate surfaces that result in reduced manufacturing yields due to lower laminate quality and significant production downtime required for metal press plate cleaning.

Therefore, it is desirable to provide a metal press plate for use in the production of laminates and multilayer materials used to fabricate circuit boards and other electronic assemblies that has a substantially reduced level of surface contamination and inherent surface imperfections and is easily cleaned such that an acceptable quality and yield in production is achieved. In addition, it is also desirable to provide a method of producing such metal press plate and reprocessing the metal press plate after use to substantially reduce the presence of surface contamination and imperfections.

SUMMARY OF THE INVENTION

The invention provides a method for producing a metal plate with a roughened matte surface, comprising steps of providing a metal plate constructed of a suitable material, such as stainless steel or aluminum, with a first planar surface, conveying the metal plate to a treatment area, conveying the metal plate at a predetermined speed and at a predetermined distance below a first delivery mechanism at the treatment area for projecting glass beads in at least one pressurized stream, projecting the pressurized stream of glass beads against the first surface as the metal plate is conveyed below the delivery mechanism, and oscillating the first delivery mechanism above the first surface at a predetermined speed for a predetermined number of oscillations to allow the pressurized stream of glass beads to substantially impinge the entire first surface of the metal plate as a first treatment.

In one version of this embodiment of the method, a second delivery system is provided for projecting glass beads in at least one pressurized stream against a second planar surface of the metal plate as the metal plate is conveyed above the second delivery mechanism at a predetermined speed and at a predetermined distance from the second delivery mechanism. The second delivery mechanism similarly oscillates below the second surface at a predetermined speed for a predetermined number of oscillations to allow the pressurized stream of glass beads to substantially impinge the entire second surface as a first treatment. In another version of this embodiment, the first and second surfaces of the metal plate may simultaneously receive the first treatment with the first and second delivery mechanisms simultaneously projecting at least one stream of pressurized glass beads against the first and second surfaces of the metal plate, respectively.

The first and second delivery mechanisms are each an array of blast nozzles or guns, well known to those skilled in the art and suitable for projecting media, which are either positioned above or below the metal plate in a linear arrangement or as a cluster of individual nozzles. The pressurized stream of glass beads is projected from individual nozzles against the first and second surfaces at a predetermined pressure and at a predetermined angle, such as, for instance, at a substantially perpendicular angle to the first and second surfaces of the metal press plate.

The method of the invention also provides a method for cleaning and reprocessing a roughened matte surface of the metal plate, similar to the method for producing the roughened matte surface, comprising steps of providing a metal plate, conveying the metal plate to a treatment area, providing a first delivery mechanism to project glass beads in at least one pressurized stream, projecting the pressurized stream of glass beads against a first surface of the metal plate, and oscillating the delivery mechanism at a predetermined speed for a predetermined number of oscillations to project glass beads against substantially the entire first surface of the metal plate as a first treatment. In one version of this embodiment of the method, a second delivery mechanism is provided similar to the first delivery mechanism, wherein the second delivery mechanism projects glass beads in at least one pressurized stream against a second surface of the metal plate as a first treatment.

The invention also provides an enhanced surface metal press plate produced according to the method of the invention for use in producing laminated and multilayer materials. The metal press plate has a roughened matte surface formed by impinging at least a first surface with a suitable medium for imparting a substantially uniform and raised surface topography.

BRIEF DESCRIPTION OF THE DRAWINGS

For a better understanding of the invention, reference is made to the drawings which are incorporated herein by reference and in which.

DETAILED DESCRIPTION OF THE INVENTION

Illustrative embodiments of the invention described below are directed to a method for producing a surface enhanced metal plate. More particularly, the invention is directed to a method for producing a metal press plate with a roughened matte surface finish having a substantially uniform and raised topography. The method of the invention also cleans and reprocesses the roughened matte surface finish of the metal press plate after repeated use to reestablish the substantially uniform and raised surface topography. Illustrative embodiments of the invention described below are also directed to a surface enhanced metal press plate produced according to the method of the invention for use in the manufacture of laminates and other multilayer materials used to fabricate circuit boards and other electronic assemblies.

Embodiments of the invention will be described with reference to FIGS. 1–12 which are presented for the purpose of illustrating embodiments and are not intended to limit the scope of the claims. As used herein, the term "roughened" refers to an irregular topography of a surface finish. The term "matte," as used herein, refers to a dull, non-shiny surface finish. The term "reestablish" and variants thereof refer to producing the substantially uniform and raised surface topography of the roughened matte surface according to the method of the invention on a metal press plate previously used in production of laminates and multilayer materials.

Figure 1:
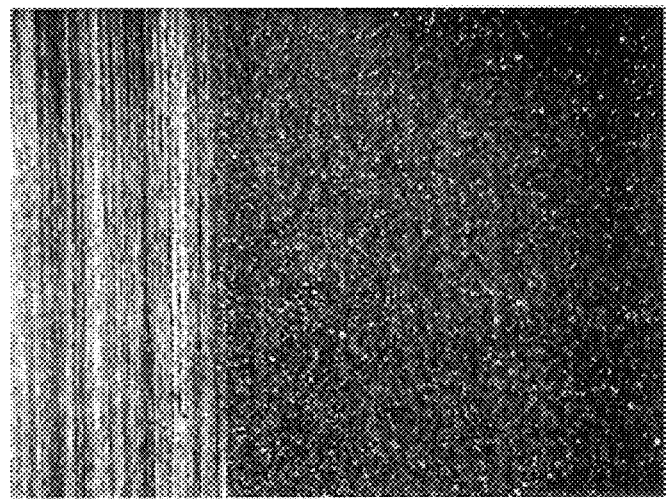
FIG. 1 is a photograph of a 10×magnification of a surface of a metal press plate with a right-hand portion of the surface enhanced according to the method of the invention.
Figure 1:
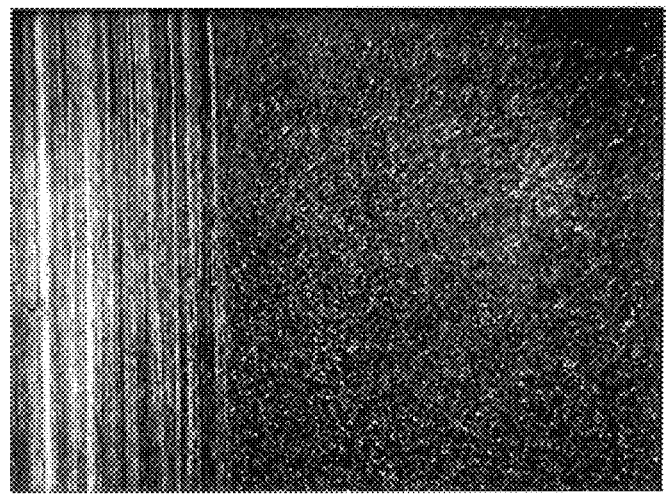

Referring to FIGS. 1–5, the invention provides a method and associated apparatus for producing a metal plate with an enhanced finish and, more particularly, a roughened and matte surface finish. The roughened matte surface finish results from creation of a substantially uniform and raised mechanical surface topography on at least a one surface of the metal press plate. According to the method of the invention, the metal plate is treated by mechanical peening or dry blasting the surface with a pressurized stream of mechanical peening or dry blasting medium sufficient to create a desired roughened and substantially uniform and raised surface topography. As used herein, the term "dry blasting" refers to any effect the pressurized stream of medium creates in or on the surface when the medium impinges the surface of the metal plate. FIG. 1 shows a 10×magnification of a surface of a metal plate, wherein the left-hand portion of the plate surface has not received mechanical peening or dry blasting according to the method of the invention, and represents a typical surface of a prior art metal plate. The right-hand portion of the plate surface shows the enhanced surface achieved by mechanical peening or dry blasting according to the method described herein. The right-hand portion of the plate surface also demonstrates the surface topography of the roughened matte surface with a substantial uniformity achieved with the method of the invention.

Figure 2:
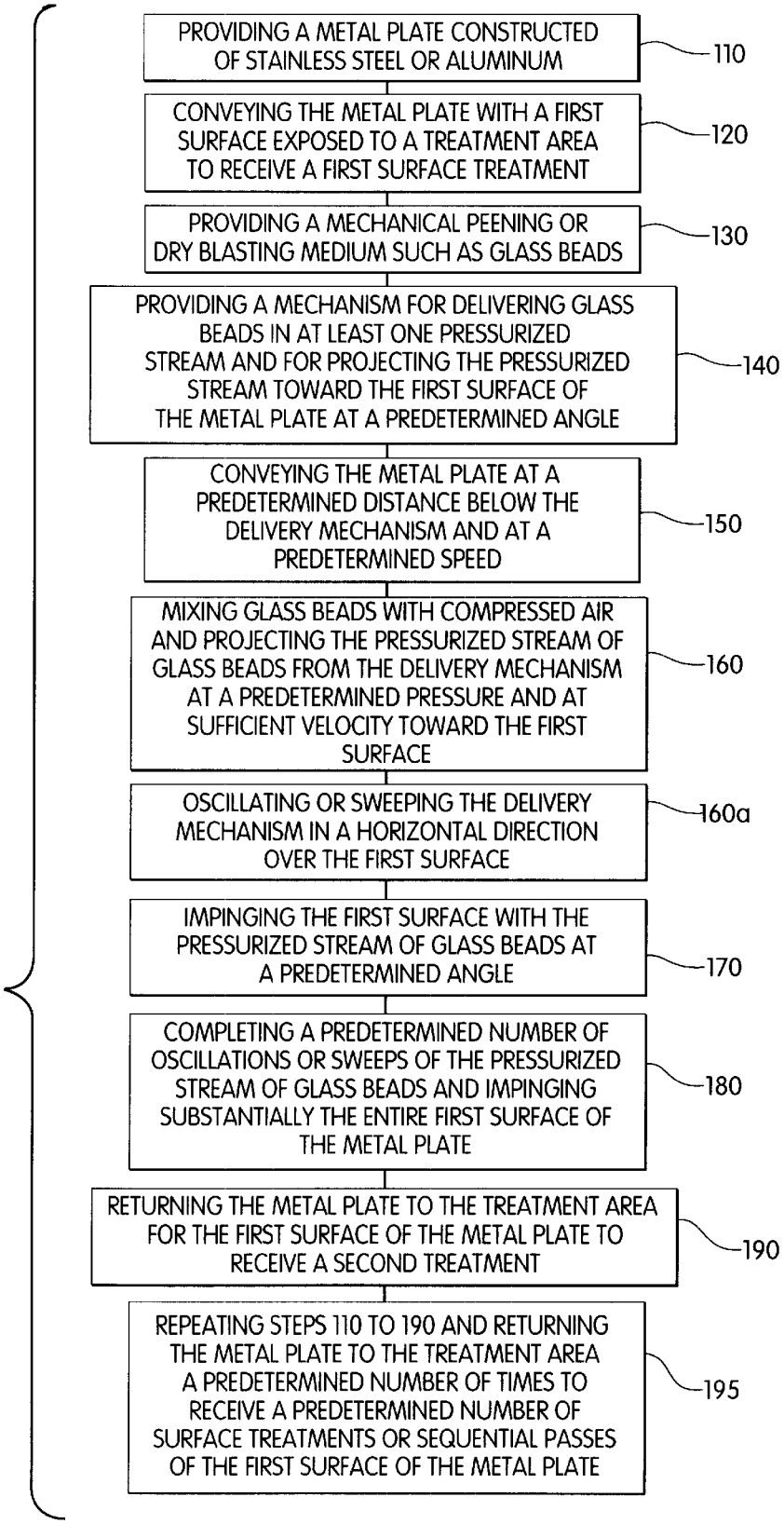
FIG. 2 is a flow diagram of the process steps of an embodiment of the method.

Referring to FIG. 2, in one embodiment of the invention, the method comprises steps of providing a metal plate constructed of a suitable material, such as, although not limited to, stainless steel or aluminum, in step 110. The metal plate is transported in step 120, with at least a first planar surface exposed, by a conveyance means to a treatment area at which a first surface treatment, or a "first pass," of the metal plate is conducted. In step 130, a mechanical peening or dry blasting medium is provided for mechanically peening or dry blasting the first planar surface of the metal plate. In this embodiment, the mechanical peening or dry blasting medium includes glass bead media, including, for example, although not limited to, silica-free, spherical glass beads having a sieve size (U.S. mesh size) of about 70 to about 100, a size range of about 0.150 mm to about 0.212 mm, and a hardness of about 5.5, such as Flex-O-Lite BT-08 glass beads available from Flex-O-Lite, Inc. of Chesterfield, Mo. Other mechanical peening or dry blasting media may be used for impinging the metal press plate and include, although are not limited to, dry plastic media, aluminum oxide media, aluminum oxide and silicon carbide media, stainless steel shot media, stainless steel shot and grit media, ceramic blasting media, and any combination thereof.

In step 140, a mechanism is provided for delivering glass beads in at least one pressurized stream and projecting such stream toward the first surface of the metal plate at a predetermined angle. In one version of the embodiment, the pressurized stream of glass beads is projected at a substantially perpendicular angle. The metal plate is conveyed through the treatment area, in step 150, at a predetermined distance below the delivery mechanism, and at a predetermined speed in a direction substantially perpendicular to a position of the delivery mechanism. In step 160, glass beads are mixed with compressed air and projected from the delivery mechanism as the pressurized stream of glass beads at a predetermined pressure and sufficient velocity toward the first surface of the metal plate. In one version of the embodiment, the delivery mechanism moves in a predetermined orientation over the metal plate. In step 160a, for instance, the delivery mechanism oscillates in a horizontal direction over the metal plate in a direction substantially perpendicular to the direction in which the metal plate is conveyed, thereby continually traversing the first surface in a back and forth or sweeping motion. In step 170, the pressurized stream of glass beads impinges the first surface at a predetermined angle as the metal plate is conveyed under the delivery mechanism. In one version of the embodiment, for instance, the pressurized stream of glass beads impinges the first surface at a substantially perpendicular angle. If the delivery mechanism horizontally oscillates over the metal plate, then the pressurized stream of glass beads similarly oscillates, traversing the first surface in a back and forth or sweeping motion. After completion of a predetermined number of movements, oscillations or sweeps of the pressurized stream of glass beads in step 180, substantially the entire first surface is impinged by glass beads. In step 190, the metal plate may be returned to the treatment area and conveyed below the pressurized stream of glass beads a second time for the first surface to receive a second surface treatment or a "second pass." In step 195, steps 110 through 190 may be repeated and the metal plate returned a predetermined number of times to the treatment area for a predetermined number of surface treatments or sequential passes required to achieve the desired substantially uniform and raised surface topography of the roughened matte surface finish on the first surface of the metal plate.

The substantial uniformity and raised surface topography of the roughened matte finish achieved according to the method of the invention depends upon the type of medium employed to treat or impinge a surface of the metal press plate. In the embodiment of the method described in reference to FIG. 2, for instance, the metal plate roughened matte surface finish is produced by impinging glass beads against the first surface of the metal plate. Under a predetermined pressure and at sufficient velocity, glass beads are projected and impinge the first surface of the metal plate such that upon impact against the first surface a portion of the projected glass beads peens the first surface, thereby creating dents or impressions in the first surface. Another portion of glass beads impinges the first surface and shatters, thereby shearing or cutting the first surface. Additionally, another portion of glass beads impinges the first surface not as spherical, whole beads, but, rather, as shattered particles, splinters or pieces of glass beads, which shear or cut the first surface upon impact. Such peening.

The roughened matte surface finish achieved by mechanical peening or dry blasting the first surface of the metal plate, for instance, with glass beads according to the embodiment of the method shown in FIG. 2, is visually uniform and has surface characteristics including a Max. Ra value of about $40\mu$, with an average of between about $34\ \mu$ to about $38\ \mu$, a Max. Rz value of about $300\ \mu$, with an average of between about $275\ \mu$ to about $290\ \mu$, and an Max. Rmax value of $500\ \mu$, with an average of between about $320\ \mu$ to about $370\ \mu$, as measured with a Perthometer surface roughness meter. Several surface readings are measured from a treated or impinged surface of the metal plate to determined surface characteristic values. The number of surface treatments or passes of the metal press plate required to achieve the desired roughened matte surface finish is from 1 to about 5 treatments or passes, although the method of the invention is not limited to any specific number of treatments or passes of the metal plate, since the surface quality achieved is dependent upon a level of surface contaminates and surface scratches, burrs and other inherent flaws and imperfections present on and in a surface of the metal plate prior to treatment.

Figure 3:
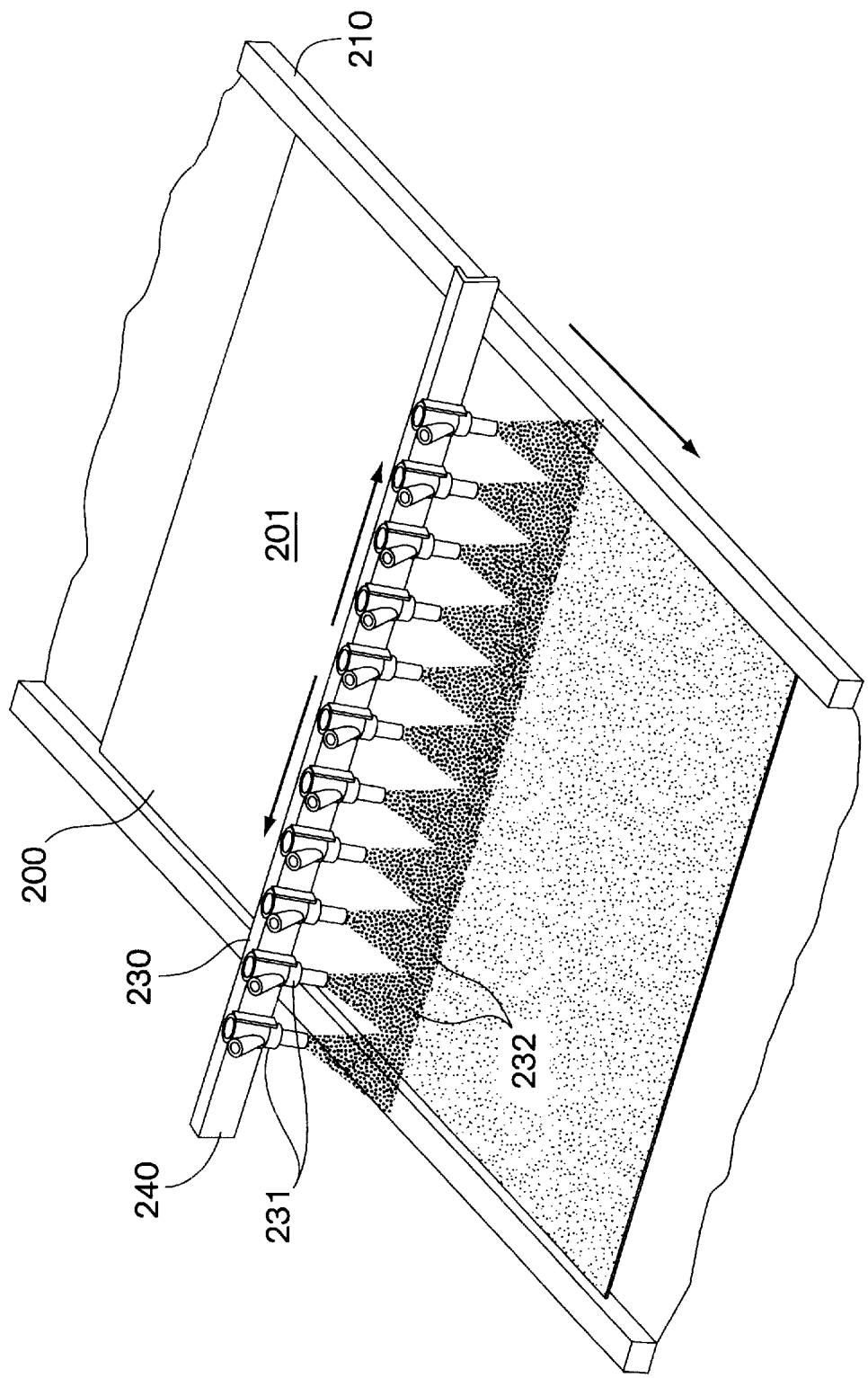
FIG. 3 is a schematic illustration of an apparatus utilized to perform one version of the steps of the method illustrated in FIG. 2.

Referring to FIG. 3, a version of the embodiment of the method shown in FIG. 2 includes a metal press plate 200 constructed of stainless steel or aluminum conveyed by a conveyance device, such as a conveying support panel 210, to a treatment area with at least a first planar surface 201 exposed. The metal press plate 200 is conveyed below a first array of blast nozzles or guns 230 of a type well known to those skilled in the art and suitable for delivering pressurized streams of glass beads, such as, although not limited to #6 guns with #6 wide spray nozzles. The metal press plate 200 is conveyed below the first array of blast nozzles 230 at a distance of about 10 cm to about 15.25 cm, and at a speed of about 120 cm/min. to about 185 cm/min. The metal press plate 200 is conveyed in a direction substantially perpendicular to the first array of blast nozzles 230. The first array of blast nozzles 230 includes a plurality of individual nozzles 231 mounted in linear arrangement and adjacent to each other on a first horizontal oscillating bar 240 of a type well known in the art, having at least a 3 inch stroke. Each nozzle 231 projects a pressurized stream of glass beads 232 under pressure of about 40 psi to 100 psi, and preferably about 80 psi, and at sufficient velocity toward the first surface 201 of the metal press plate 200. As the metal press plate 200 is conveyed below the first array of blast nozzles 230, the first surface 201 is impinged by at least one pressurized stream of glass beads 232. The pressurized stream of glass beads 232 impinges the first surface 201 at a substantially perpendicular angle. However, in other versions of the embodiment, the angle of the stream of glass beads 232 may be altered to enable the stream of glass beads 232 to impinge the first surface at a predetermined angle. A position of an individual nozzle 231 may be adjusted to alter the angle with which the pressurized stream of glass beads 232 impinges the first surface 201, or, alternatively, the oscillating bar 240 may be adjusted to alter the angle of the pressurized streams delivered by the entire first array of blast nozzles 230. In one version of the embodiment, as the metal press plate 200 is conveyed below the first array of blast nozzles 230, the first oscillating bar 240 horizontally oscillates the array of blast nozzles 230 over the metal press plate 200. The oscillating bar 240 horizontally oscillates the array of blast nozzles 230 at a predetermined speed of about 60 cpm to about 120 cpm, allowing the pressurized stream of glass beads 232 to continually traverse the first surface 201 in a back and forth manner or sweeping motion. The oscillating action of the array of blast nozzles 230 allows the first surface 201 to be repeatedly impinged by at least one pressurized stream of glass beads 232. Depending upon the area range over which the first array of blast nozzles 230 oscillates, the first surface 201 of the metal press plate 200 may be impinged by more than one pressurized stream of glass beads 232. The first array of blast nozzles 230 is oscillated over the metal press plate 200 for a predetermined number of times or sweeps to allow at least one pressurized stream of glass beads 232 to impinge substantially the entire first surface 201 of the metal press plate 200, as the metal press plate 200 is conveyed under the first array 230. The metal press plate 200 may be returned to the treatment area after completion of the first surface treatment to be conveyed under the first array of blast nozzles 230 for a second surface treatment or a second pass. Thereafter, the metal press plate 200 may be returned for a predetermined number of times to the treatment area to allow the first surface 201 to receive a predetermined number of sequential surface treatments or passes required to achieve a desired roughened matte surface having a substantially uniform and raised surface topography.

Figure 4:
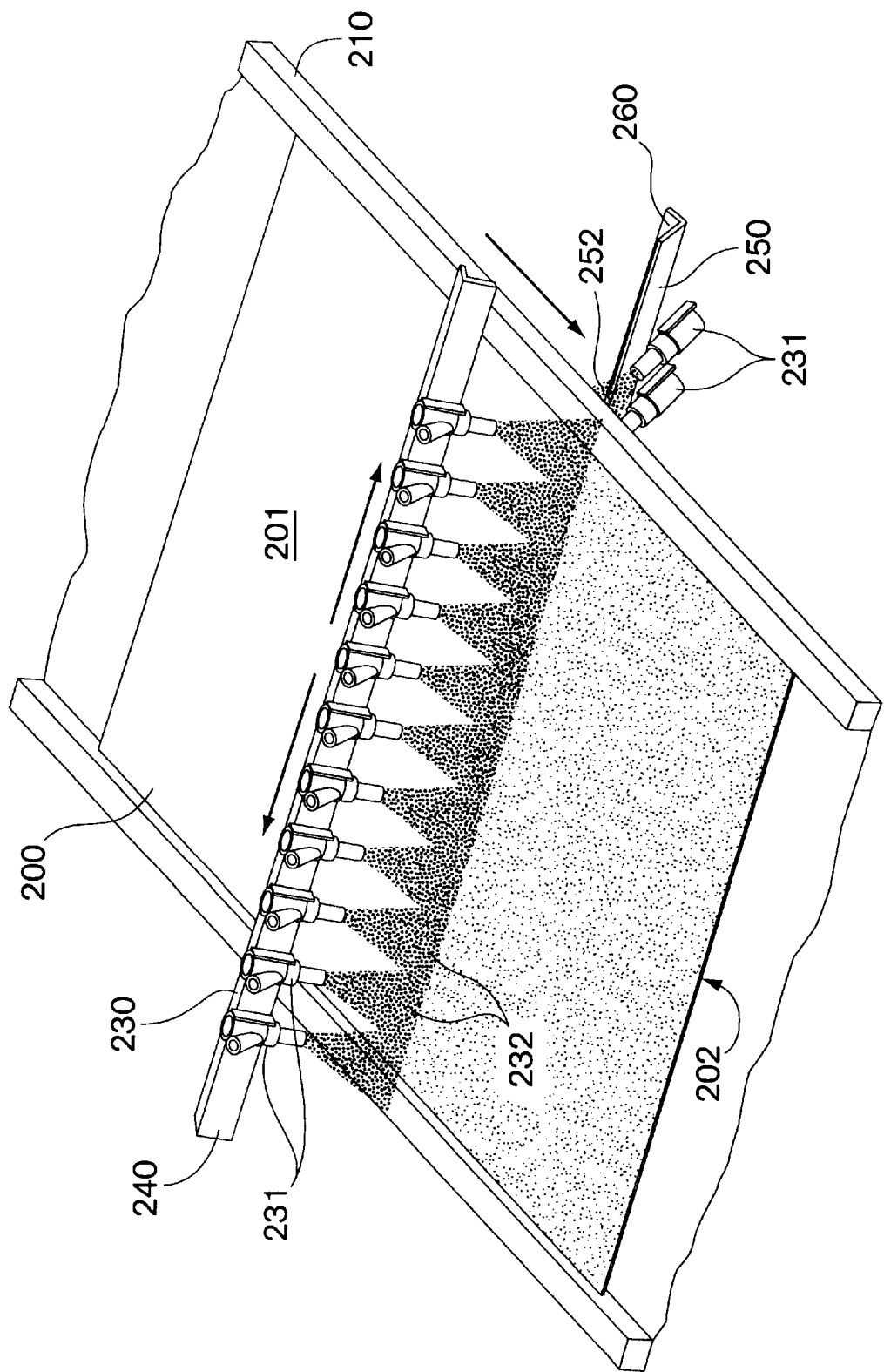
FIG. 4 is a schematic illustration of an apparatus utilized to perform another version of the steps of the method illustrated in FIG. 2.

Referring to FIG. 4, another version of the embodiment of the method shown in FIG. 2 includes a second array of blast nozzles 250, similar to the first array of blast nozzles 230 shown in FIG. 3, that is positioned at a predetermined distance of about 10 cm to about 15.25 cm below the metal press plate 200 as the metal press plate 200 is conveyed through the treatment area. The second array of blast nozzles 250 allows simultaneous surface treatment of a second surface 202 of the metal press plate 200 as the first surface 201 of the metal press plate 200 is treated by the first array of blast nozzles 230. The second array of blast nozzles 250 is similarly constructed and includes a plurality of individual nozzles 251 mounted in linear arrangement and adjacent to each other on a second horizontal oscillating bar 260. Each nozzle 251 delivers a pressurized stream of glass beads 252 under pressure of about 40 psi to about 100 psi, and preferably 80 psi, and at sufficient velocity against the second surface 202 of the metal press plate 200. In one version of the embodiment, the second oscillating bar 260 horizontally oscillates the second array of blast nozzles 250 under the second surface 202 of the metal press plate 200 at a predetermined speed of about 60 cpm to about 120 cpm for a predetermined number of oscillations or sweeps over the metal press plate 200 such that at least one pressurized stream of glass beads 252 impinges substantially the entire second surface 202. The pressurized stream of glass beads 252 impinges the second surface 202 at a substantially perpendicular angle. However, the angle of the pressurized stream of glass beads 252 may be altered by either adjusting individual nozzles 251 or, alternatively, the angle of the second oscillating bar 260 may be adjusted to deliver impinging glass beads to the second surface 202 at a predetermined angle. The metal press plate 200 may be similarly returned to the treatment area for a predetermined number of times in order the second surface 202 may receive a predetermined number of sequential surface treatments or passes to achieve a desired roughened matte surface having a substantially uniform and raised surface topography.

Figure 5:
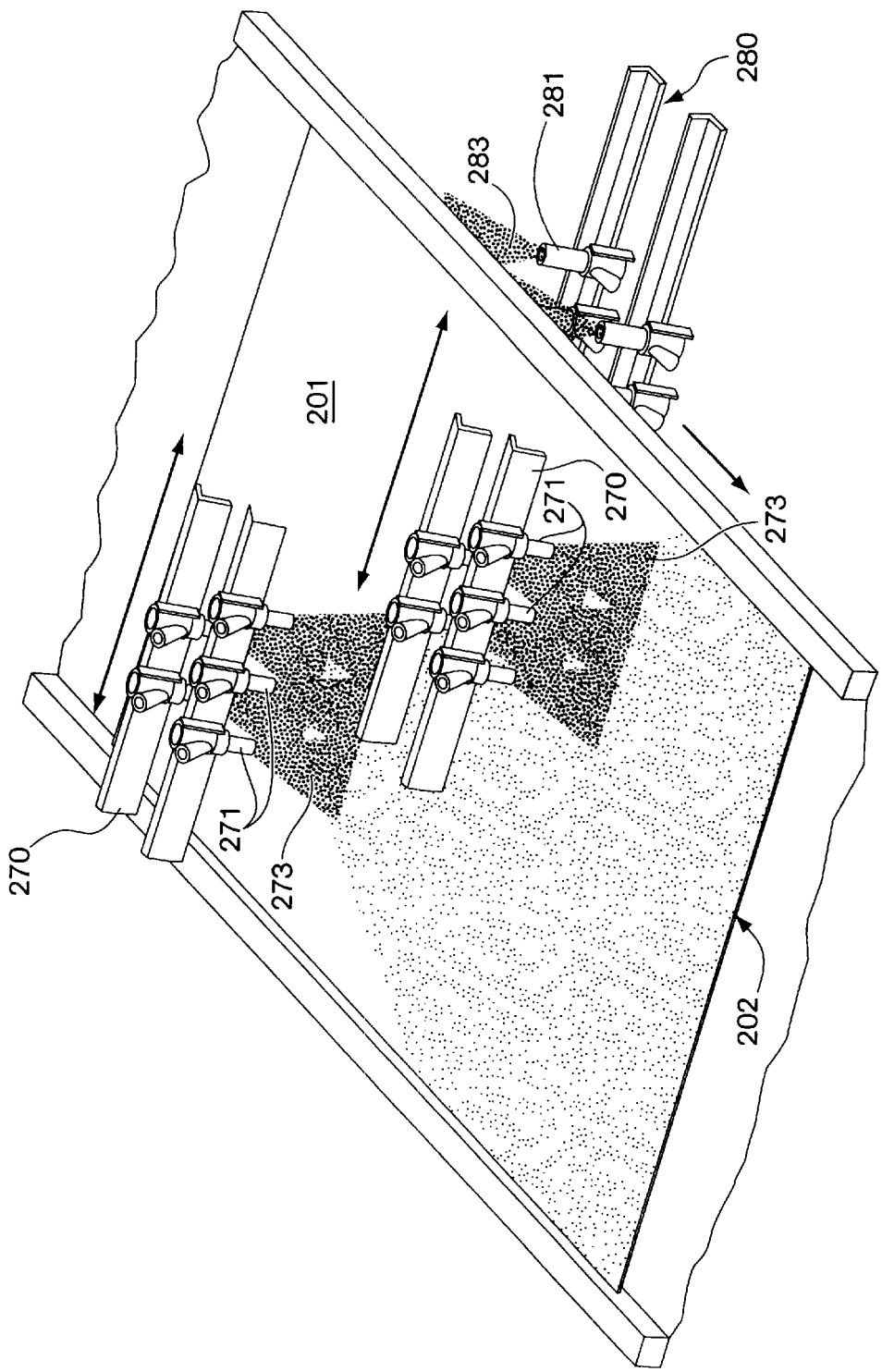
FIG. 5 is a schematic illustration of an apparatus utilized to perform still another version of the steps of the method illustrated in FIG. 2.

Referring to FIG. 5, still another version of the embodiment shown in FIG. 2 includes at least a first array of blast nozzles 270 of a type well known to those skilled in the art positioned at a predetermined distance of about 10 cm to about 15.25 cm above the metal press plate, wherein the array 270 includes a plurality of individual nozzles 271 mounted together as a group or nozzle cluster. As shown in FIG. 5, a plurality of nozzle clusters 270 may be employed. Each nozzle 271 delivers a pressurized stream of glass beads 273 under pressure of about 40 psi to about 100 psi, and preferably of about 80 psi, and at sufficient velocity toward the first surface 201 of the metal press plate 200 such that the pressurized stream of glass beads 273 impinges the first surface 201 at a predetermined angle. In one version of the embodiment, the nozzle cluster 270 may be oscillated or swept above the metal press plate 200 in a variety of predetermined orientations or directions, to continually traverse the first surface 201 until substantially the entire first surface 201 of the metal press plate 200 is impinged by glass beads. In another version of the embodiment, at least a second array of blast nozzles 280 may be positioned at a predetermined distance of about 10 cm to about 15.25 cm below the metal press plate 200 to simultaneously treat the second surface 202 of the metal press plate 200 as the first surface 201 of the metal press plate 200 is being treated by the first array of blast nozzles 270. The second array of blast nozzles 280 is similarly of a type well known to those skilled in the art and includes a plurality of individual nozzles 281 mounted together as a nozzle cluster 280. Each nozzle 281 delivers a pressurized stream of glass beads 283 under pressure of about 40 psi to about 100 psi, and preferably of about 80 psi, and at sufficient velocity toward the second surface 2021 of the metal press plate 200 such that the pressurized stream of glass beads 283 impinges the second surface 202 at a predetermined angle. The nozzle cluster 280 may be similarly oscillated or swept below the metal press plate 200 in a variety of orientations and directions to continually traverse the second surface 202 until substantially the entire second surface 202 of the metal press plate is impinged by glass beads.

The method of the invention also cleans and reprocesses the enhanced roughened matte surface of the metal press plate after repeated use in laminate and multilayer materials production. The method described above with reference to FIGS. 1–5 is used to impinge at least a first surface of a metal press plate previously used in producing laminated and multilayer materials. At least one stream of pressurized mechanical peening or dry blasting medium, such as glass beads, impinges the surface of the metal press plate and mechanically removes solidified epoxy resin particles, epoxy resin dust, fibers and other surface contaminants, which have accumulated and adhered to the surface of the metal press plate during production. The mechanical peening or dry blasting glass beads impinge the surface of the metal press plate and mechanically dislodge surface contaminants embedded within the raised surface topography, as well as remove or deburr small and fine scratches, burrs and other similar surface flaws and imperfections, thereby reestablishing the roughened matte surface having a substantially uniform and raised surface topography. The method described in reference to FIGS. 4 and 5 may be also be used to simultaneously clean and reprocess a second surface of the metal plate to reestablish the desired roughened matte surface finish while the first surface is similarly cleaned and reprocessed. The method of the invention cleans and reprocesses surfaces of the metal press plate previously used such that desired surface characteristics are restored and are substantially equivalent to those achieved in surfaces of a new metal press plate prior to use. The number of surface treatments or passes of the metal press plate below and/or above the pressurized stream of peening or dry blasting glass bead medium required to restore the desired surface characteristics of the roughened matte finish is dependent upon the level of contaminants and flaws and imperfections present in and on the surface of the metal press plate after use in producing laminated and multilayer materials. Resolution of the metal press plate surface topography according to the method of the invention described herein provides a simple and easily performed cleaning and reprocessing solution without additional direct material costs of production.

Referring to FIGS. 6–9, the invention also provides a metal press plate 310 with an enhanced matte finish of a substantially uniform and raised mechanical surface topography 320 produced in accordance with the method of the invention described herein. The metal press plate 310 is constructed of aluminum or stainless steel, such as, although not limited to, 420 grade stainless steel, as manufactured by C. A. Picard of Germany, and 630 grade stainless steel, as manufactured by Bohler Bleche of Austria. Other suitable grades of stainless steel may be used to construct the metal press plate 310 including 304 grade and 316 grade stainless steel. The metal press plate 310 is typically about 0.089 cm to about 0.1905 to cm in thickness, having dimensions of about 83 cm×111 cm to about 127 cm×148 cm. However, the metal press plate 310 of the invention is not limited to any specific thickness or overall dimensions.

Figure 6:
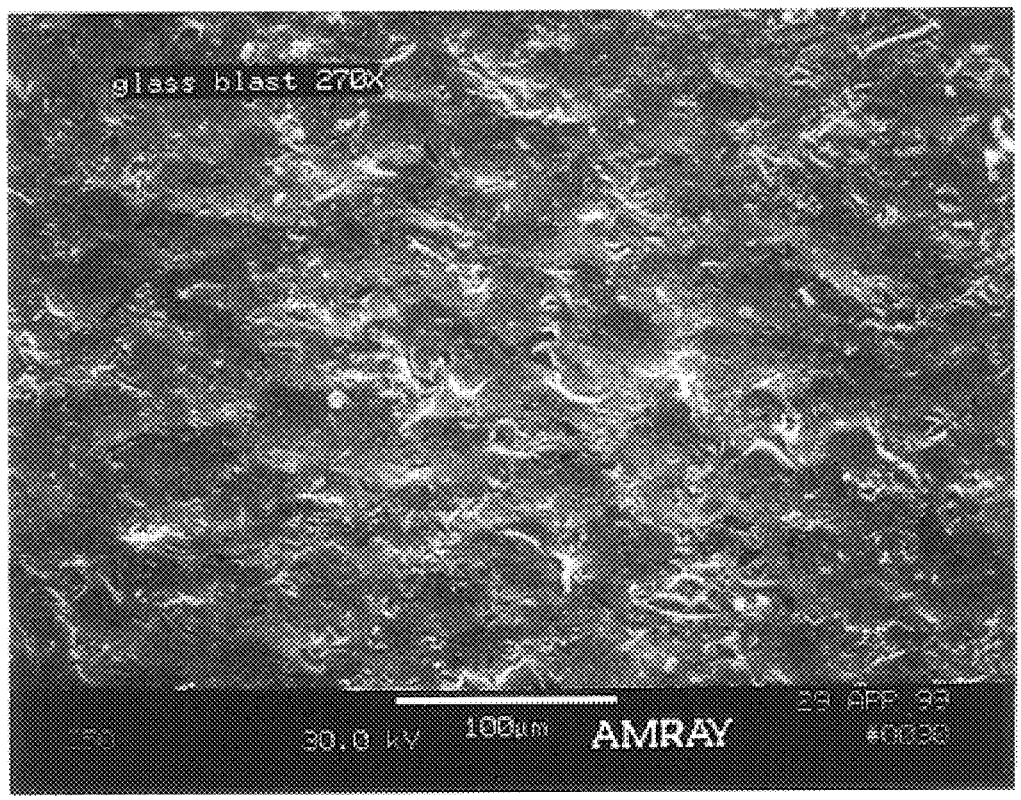
FIG. 6 is a photograph of a 250×magnification of a surface of a metal press plate enhanced according to the method of FIG. 2.
Figure 7:
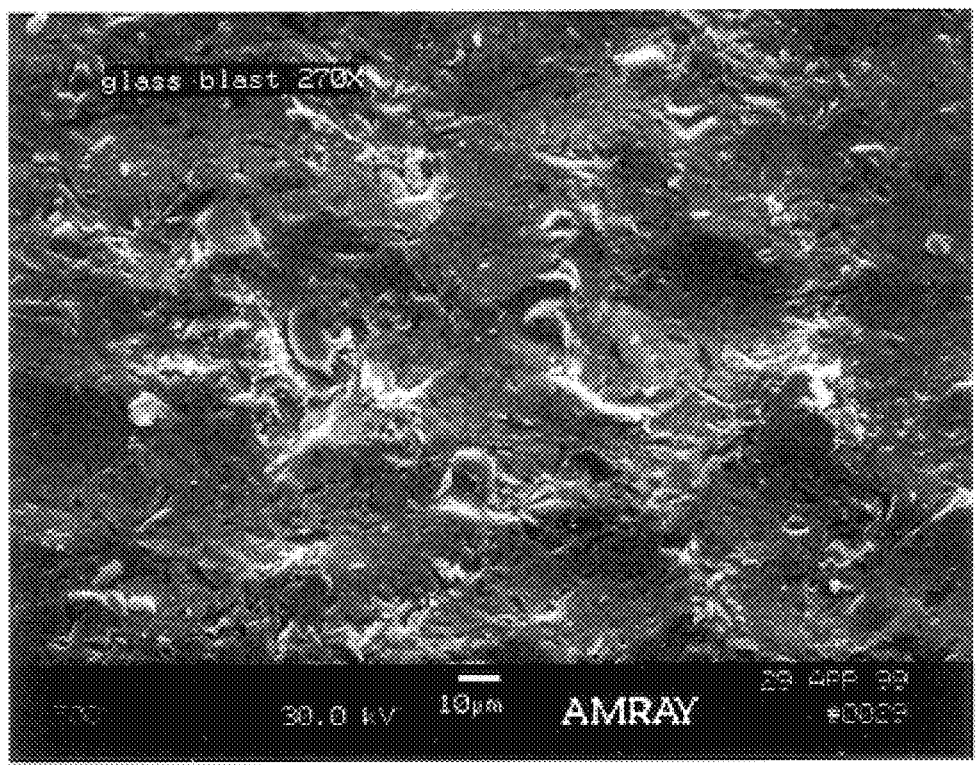
FIG. 7 is a photograph of a 500×magnification of the surface of the metal press plate of FIG. 6.

FIGS. 6 and 7 include magnified images of a surface of a metal press plate finished by passing the surface 270 times (270×) through mechanically peening or dry blasting pressurized streams of glass beads. As demonstrated by a 250× magnification of the first surface of the metal press plate 310 provided in FIG. 6, the surface topography achieved is a mechanically raised microstructure with a high profile. The raised microstructure is substantially uniform across the surface of the metal press plate 310 as shown in FIG. 6, and as demonstrated by a 500×magnification of the surface shown in FIG. 7. The raised microstructure imparts a matte type of finish to the surface of the metal plate 310 in contrast to a high polish finish of prior art metal press plates typically used in laminate production. The surface of the metal press plate shown in FIGS. 6 and 7 demonstrate that the roughened matte surface of the metal press plate is reestablished and maintained after repeated passes or treatments according to the method of the invention. The enhanced surface metal press plate may, therefore, be repeatedly used in laminate and multilayer materials production.

Figure 8:
FIG. 8 is a photograph of a 250×magnification of a surface of a prior art metal press plate.
Figure 9:
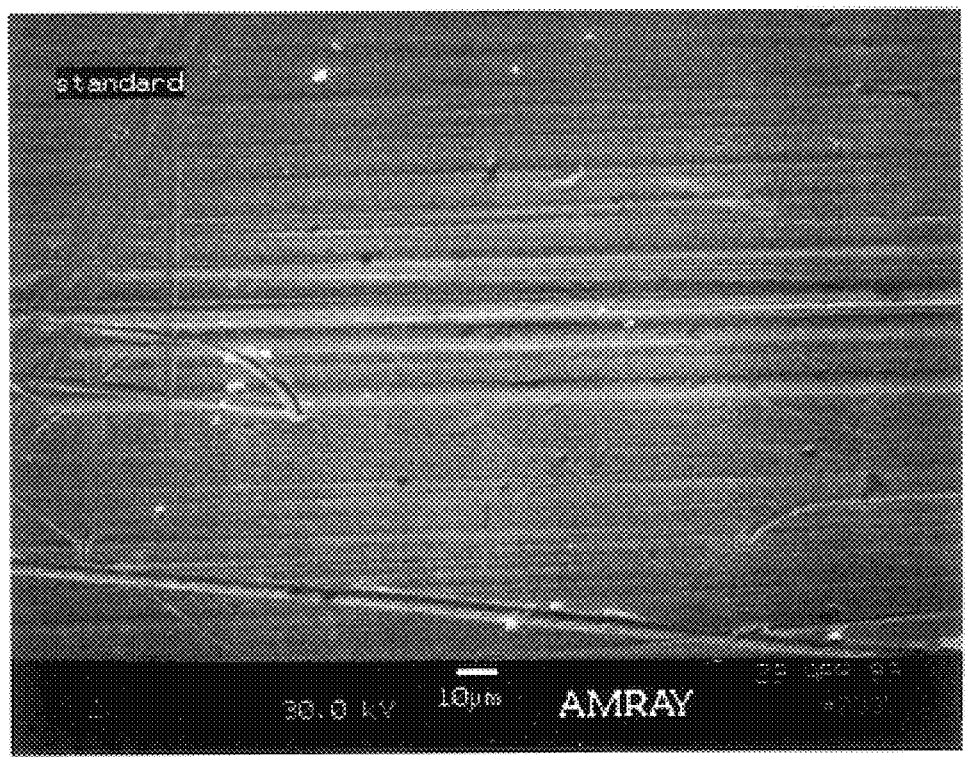
FIG. 9 is a photograph of a 500×magnification of the surface of the prior art metal press plate of FIG. 8.

FIGS. 8 and 9 show a surface of a prior art metal press plate with a high polish finish, such as a number 6 finish (6 to 8 RMS in microinches). As indicated by a 250× magnification of the surface of the prior art metal press plate in FIG. 8, and a 500×magnification of the same surface in FIG. 9, scratches, burrs and other flaws and imperfections remain on and in the surface of the prior art metal press plate despite a high polish finish. Such surface anomalies, however, are not substantially prevalent in the surface of the metal press plate 310 shown in FIGS. 6 and 7.

Surface anomalies, such as contaminants, scratches, burrs and similar flaws and imperfections found on and in surfaces of prior art metal press plates consequently produce corresponding anomalies in surfaces of laminates and multilayer materials manufactured using such prior art metal press plates, and, therefore, are critical with respect to manufacturing quality and yield. For instance, with respect to the production of metal foiled laminates used to fabricate circuit boards and other electronic assemblies, surface integrity of metal press plates is important at the pressing or lamination phase of production during which metal foil, primarily copper foil, is pressed and bonded to single or multiple ply substrates referred to as prepregs. Metal press plates press copper foil against prepreg surfaces during lamination to produce copper foiled laminates. Surface anomalies present in the surfaces of metal press plates can potentially produce corresponding unwanted impressions, pits and other blemishes in the foiled surfaces of laminates. Such surface defects are critical flaws that compromise the quality of copper foiled laminates, for instance, by interfering with circuit formation during subsequent production phases. In addition to the inherent surface scratches, burrs and similar flaws and imperfections in the surfaces of prior art metal press plates, surface contaminants are potentially present on the surfaces of prior art metal press plates that compromise laminate quality and manufacturing yield. Particularly problematic are airborne contaminants, such as epoxy resin dust and airborne fibers, which are produced during laminate production and which escape removal by clean room protocol techniques. Such airborne contaminants remain afloat in the atmosphere surrounding the metal press plates and eventually adhere to surfaces of metal press plates. Also, epoxy resin particles adhere to and solidify on surfaces of metal press plates producing hardened epoxy "spots." Airborne contaminants and epoxy "spots" similarly create critical flaws in surfaces of copper foiled laminates that effect laminate quality and manufacturing yield.

The surface of the metal press plate 310 of the invention shown in FIGS. 6 and 7 is substantially free of the surface contaminants, scratches, burrs and similar inherent flaws and imperfections associated with highly polished prior art metal press plate surfaces. The substantially uniform and raised surface topography of the metal press plate 310 preferentially adheres and mechanically bonds airborne contaminants and epoxy "spots" such that consequent surface defects and blemishes in copper foil laminates are substantially reduced. As airborne contaminants and epoxy particles alight on the roughened matte surface of the metal press plate 310, the airborne contaminants and epoxy particles become embedded in the raised surface topography and mechanically bond to the surface microstructure. In effect, the contaminants and particles are substantially removed from the functional surface of the metal press plate 310. Such a reduction in surface contaminants allows the metal press plate 310 of the invention to provide copper foiled laminates of higher quality, thereby increasing laminate manufacturing yields.

Figure 10:
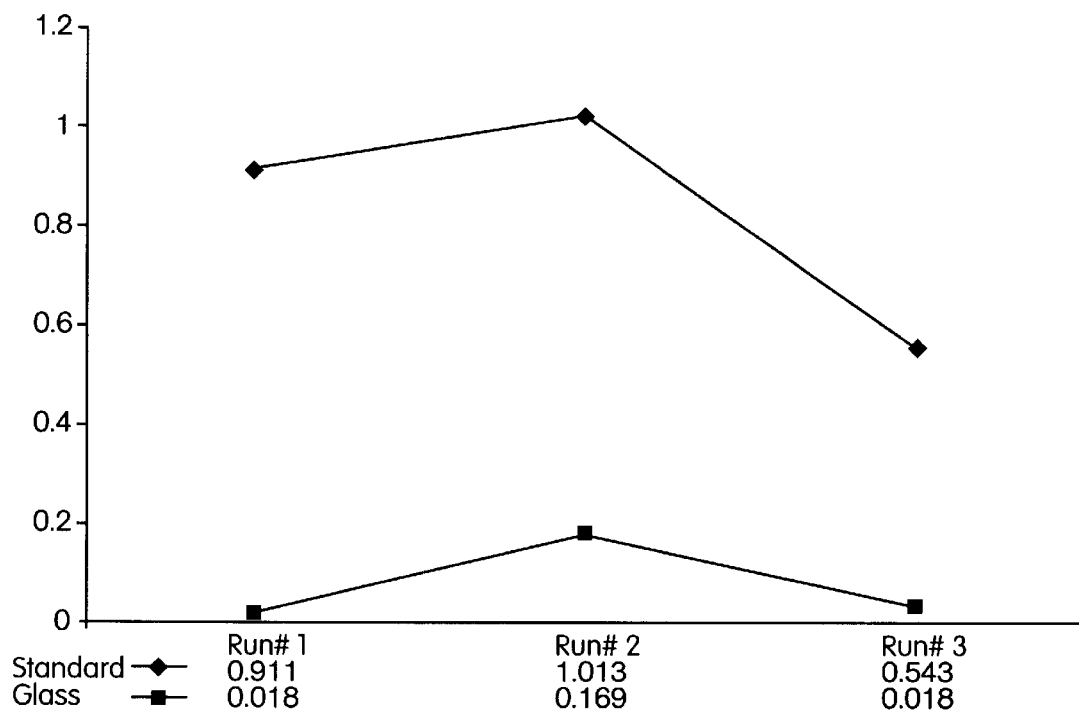
FIG. 10 illustrates comparison data of the number of epoxy spots per surface square foot of copper foiled laminate panels.

Referring to the graph illustrated in FIG. 10, data is presented which compares the number of epoxy spots present on surfaces of copper foiled laminate panels pressed against the metal press plate of the invention, with the number of epoxy spots present on surfaces of copper foiled laminate panels pressed against a high polish prior art metal press plate to demonstrate the effectiveness of the raised surface topography provided by the metal press plate of the invention. Specifically, FIG. 9 illustrates the number of epoxy "spots" or solidified epoxy resin particles present per square foot of laminate panel pressed with 1 oz. of standard copper foil. The surface area of each laminate panel is approximately 5.167 sq.ft. Each of three production runs (referred to as "Run #1", "Run #2" and "Run #3 in FIG. 10) includes 16 to 18 laminate panels pressed against the metal press plate of the invention and 16 to 18 laminate panels pressed against the prior art metal press plate, for a total number of 32 to 36 panels per run. The results achieved using the metal press plate of the invention are indicated in the row designated "Glass," referring to glass beads used as the mechanical peening or dry blasting medium to surface treat the metal press plate of the invention. The number of epoxy spots per surface square foot (referred to as "spots/surfaceft$^2$" in FIG. 10) of laminate panel are graphically displayed for each production run. Epoxy spots ranged in size from 0.001 inch to 0.015 inch, and in some instances were greater than 0.015 inch. The results of each production run indicate that copper foiled laminate panels pressed against the metal press plate of the invention have fewer epoxy spots per surface square foot than copper foiled laminates pressed against the prior art metal press plate. For instance, in production Run #1 copper foiled laminate panels produced by pressing against the metal press plate of the invention had substantially less than 1 spot per surface square foot, i.e., 0.018 spots/surfaceft$^2$, while copper foiled laminate panels produced by pressing against the prior art metal plate had a substantially greater number of spots per surface square foot, i.e., 0.911 spots/surfaceft.$^2$ The reduction in the number of epoxy spots per surface square foot of laminate panel achieved with the metal press plate of the invention demonstrates the effectiveness of the roughened matte surface in removing surface contaminants and imperfections from the functional surface of the metal press plate.

Figure 11:
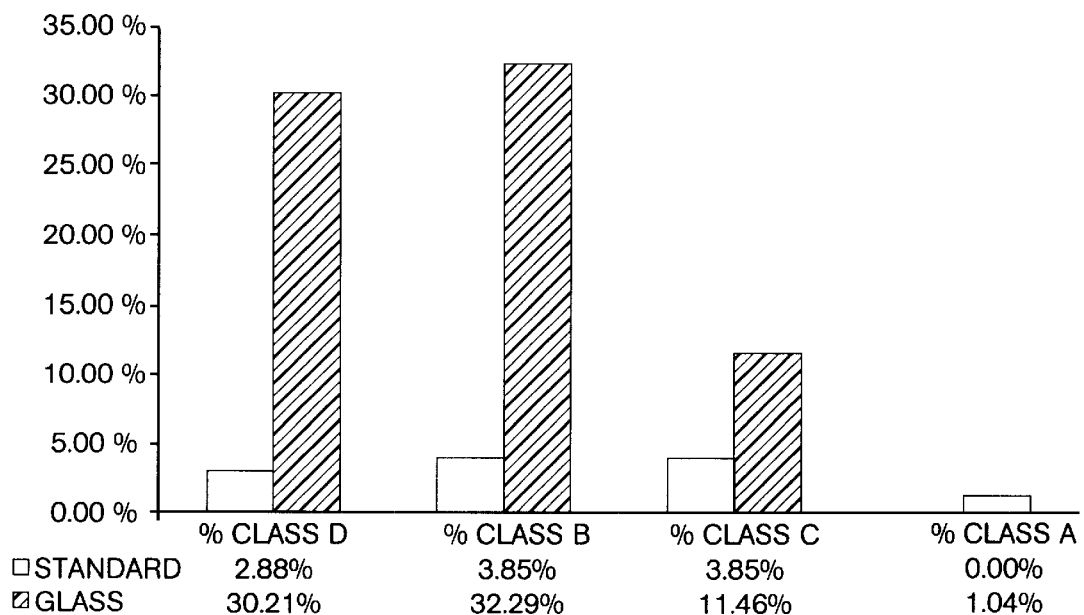
FIG. 11 illustrates comparison data of the surface quality grades of copper foiled laminate panels.

The surface quality of copper foiled laminate panels achieved with the metal press plate of the invention is also substantially higher than the surface quality of copper foiled laminate panels achieved with a prior art metal press plate having a high polish surface finish. Referring to FIG. 11, results are illustrated of a comparison of the surface quality of laminate panels pressed against the metal press plate of the invention and a prior art metal press plate. The results represent the average surface quality grading of laminate panels reported by three fabrication inspectors for two production runs. In each of the two production runs, laminate panels were pressed with 1 oz. standard copper foil and included 17 panels pressed against the metal press plate of the invention and 16 panels pressed against the prior art metal press plate. Each of three fabrication inspectors inspected the surface quality of each copper foiled laminate panel produced. Surface quality grades given to foiled laminate panels include Class A, Class B, Class C, Class D and Reject, which refer to grading criteria in accordance with IPC-4101 (Specifications for Base Materials for Rigid and Multilayer Printed Boards). The term "Glass" in FIG. 11 similarly refers to the metal press plate of the invention, indicating that glass beads were used as the mechanical peening or dry blasting medium to produce the roughened matte surface in accordance with the method of the invention. The results illustrated in FIG. 11 indicate that copper foiled laminate panels produced with the metal press plate of the invention had a substantially higher surface quality than copper foiled laminate panels produced with the prior art metal press plate. For instance, the metal press plate of the invention produced 32.29% of laminate panels with a Class B surface quality grade, while only 3.85% of laminate panels produced with the prior art metal press plate achieved a Class B surface quality grade.

Figure 12:
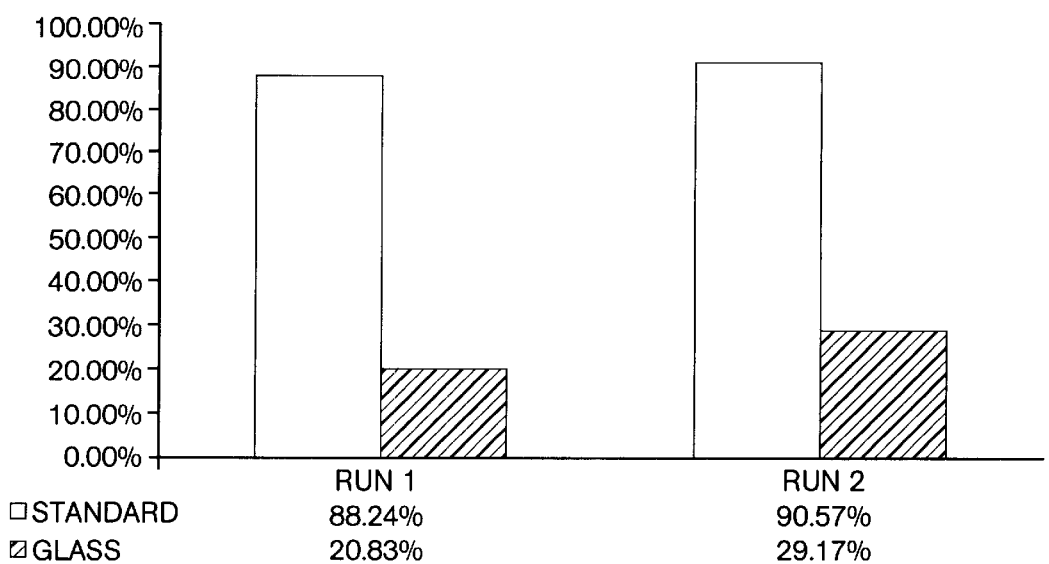
FIG. 12 illustrates comparison data of the average percentage of rejected copper foiled laminate panels.

FIG. 12 illustrates the average percentage of copper foiled laminate panels produced by the two productions runs of FIG. 11, which were rejected by the three fabrication inspectors due poor surface quality. A substantially larger average percentage of copper foiled laminate panels pressed against the prior art metal press plate was rejected from the two production runs in comparison to the average percentage of copper foiled laminate panels pressed against the metal plate of the invention. For instance, in Run #1, the average rejection percentage of laminate panels produced with the prior art metal press plate was 88.24%, while the average rejection percentage of laminate panels produced with the metal press plate of the invention was 20.83%.

As demonstrated by data presented in FIGS. 10–12, the method of the invention and the surface enhanced metal press plate produced thereof provide an improved alternative to prior art metal press plates used in laminate and multilayer materials production. The enhanced matte surface finish of the metal press plate of the invention provides a unique roughened and substantially uniform and raised mechanical surface topography that substantially reduces surface contaminants and inherent surface imperfections, which ultimately translates into metal foil laminates of high surface quality and increased laminate production yields.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method for producing a roughened matte surface on a metal plate, comprising steps of:
   providing a metal plate constructed of a suitable material with a first planar surface;
   conveying the metal plate to a treatment area;
   providing a first delivery mechanism at the treatment area to project glass beads in at least one pressurized stream against the first surface of the metal plate;
   conveying the metal plate at a predetermined speed and at a predetermined distance below the first delivery mechanism;
   projecting the pressurized stream of glass beads against the first surface; and
   oscillating the first delivery mechanism above the first surface at a predetermined oscillation speed and for a predetermined number of oscillations to project glass beads against substantially the entire first surface of the metal plate as a first treatment.

2. The method of claim 1, further comprising a step of returning the metal plate to the treatment area for a second treatment of the first surface.

3. The method of claim 1, further comprising a step of returning the metal plate to the treatment area a predetermined number of times for the first surface to receive a plurality of treatments.

4. The method of claim 1, wherein the step of projecting the pressurized stream of glass beads against the first surface includes mixing the glass beads with compressed air, and projecting the stream of compressed air and the glass beads entrained therein from the first delivery mechanism.

5. The method of claim 1, further comprising steps of providing a second delivery mechanism to project glass beads in at least one pressurized stream against a second planar surface of the metal plate opposite the first surface, and projecting the pressurized stream of glass beads against the second surface.

6. The method of claim 5, further comprising a step of oscillating the second delivery mechanism above the second surface at a predetermined oscillation speed and for a predetermined number of oscillations to project glass beads against substantially the entire second surface of the metal plate as a first treatment.

7. The method of claim 5, wherein the step of projecting the pressurized stream of glass beads against the second surface includes mixing the of glass beads with compressed air, and projecting the stream of compressed air and the glass beads entrained therein from the second delivery mechanism.

8. The method of claim 1, wherein the glass beads are projected against the first surface at a predetermined angle.

9. The method of claim 1, wherein the glass beads are projected against the first surface at a substantially perpendicular angle.

10. The method of claim 1, wherein the first delivery mechanism is an array of blast nozzles positioned in a linear arrangement above the metal plate.

11. The method of claim 1, wherein the first delivery mechanism is an array of blast nozzles positioned in a cluster above the metal plate.

12. The method of claim 1, wherein the metal plate is constructed of a suitable material selected from the group consisting of stainless steel and aluminum.

13. The method of claim 1, wherein the predetermined speed at which the metal plate is conveyed is about 120 cm/min. to about 185 cm/min.

14. The method of claim 1, wherein the predetermined distance below the delivery mechanism at which the metal plate is conveyed is about 10 cm to about 15.25 cm.

15. The method of claim 1, wherein the predetermined speed with which the delivery mechanism oscillates is about 60 cpm to about 120 cpm.

16. A method for cleaning and reprocessing a roughened matte surface on a metal plate, comprising steps of:
providing a metal plate constructed of a suitable material with a first planar surface;
conveying the metal plate to a treatment area;
providing a first delivery mechanism at the treatment area to project glass beads in at least one pressurized stream against the first surface of the metal plate;
conveying the metal plate at a predetermined speed and at a predetermined distance below the first delivery mechanism;
projecting the pressurized stream of glass beads against the first surface; and
oscillating the first delivery mechanism above the first surface at a predetermined oscillation speed and for a predetermined number of oscillations to project glass beads against substantially the entire first surface of the metal plate as a first treatment.

17. The method of claim 16, further comprising a step of returning the metal plate to the treatment area for a second treatment of the first surface.

18. The method of claim 16, further comprising a step of returning the metal plate to the treatment area a predetermined number of times for the first surface to receive a plurality of treatments.

19. The method of claim 16, wherein the step of projecting the pressurized stream of glass beads against the first surface includes mixing the glass beads with compressed air, and projecting the stream of compressed air and the glass beads entrained therein from the first delivery mechanism.

20. The method of claim 16, further comprising steps of providing a second delivery mechanism to project the glass beads in at least one pressurized stream against a second planar surface of the metal plate opposite the first surface, and projecting the pressurized stream of glass beads against the second surface.

21. The method of claim 20, further comprising a step of oscillating the second delivery mechanism above the second surface at a predetermined oscillation speed and for a predetermined number of oscillations to project glass beads against substantially the entire second surface of the metal plate as a first treatment.

22. The method of claim 21, wherein the step of projecting the pressurized stream of glass beads against the second surface includes mixing the glass beads with compressed air, and projecting the stream of compressed air and the glass beads entrained therein from the second delivery mechanism.

23. The method of claim 16, wherein the glass beads are projected against the first surface at a predetermined angle.

24. The method of claim 16, wherein the glass beads is projected against the first surface at a substantially perpendicular angle.

25. The method of claim 16, wherein the first delivery mechanism is an array of blast nozzles positioned in a linear arrangement above the metal plate.

26. The method of claim 16, wherein the first delivery mechanism is an array of blast nozzles positioned in a cluster above the metal plate.

27. The method of claim 16, wherein the metal plate is constructed of a suitable material selected from the group consisting of stainless steel and aluminum.

28. The method of claim 16, wherein the predetermined speed at which the metal plate is conveyed is about 120 cm/min. to about 185 cm/min.

29. The method of claim 16, wherein the predetermined distance below the delivery mechanism at which the metal plate is conveyed is about 10 cm to about 15.25 cm.

30. The method of claim 16, wherein the predetermined speed with which the delivery mechanism oscillates is about 60 cpm to about 120 cpm.

31. A method for producing a roughened matte surface on a metal plate, comprising steps of:
providing a metal plate constructed of a suitable material with a first planar surface;
conveying the metal plate to a treatment area;
providing a first delivery mechanism at the treatment area to project glass beads in at least one pressurized stream against the first surface of the metal plate;
conveying the metal plate at a predetermined speed and at a predetermined distance below the first delivery mechanism;
projecting the pressurized stream of glass beads from the first delivery mechanism against the first surface;
oscillating the first delivery mechanism above the first surface at a predetermined oscillation speed and for a predetermined number of oscillations to project glass beads against substantially the entire first surface of the metal plate as a first treatment;
providing a second delivery mechanism to project glass beads in at least one pressurized stream against a second planar surface of the metal plate opposite the first surface;

projecting the pressurized stream of glass beads from the second delivery mechanism against the second surface; and oscillating the second delivery mechanism below the second surface at a predetermined oscillation speed and for a predetermined number of oscillations to project glass beads against substantially the entire second surface of the metal plate as a first treatment.

32. The method of claim 31, wherein the step of projecting the pressurized stream of glass beads from the first delivery mechanism against the first surface occurs simultaneously with the step of projecting the pressurized stream of glass beads from the second delivery mechanism against the second surface.

* * * * *

UNITED STATES PATENT AND TRADEMARK OFFICE
CERTIFICATE OF CORRECTION

PATENT NO. : 6,584,820 B1 Page 1 of 1
DATED : July 1, 2003
INVENTOR(S) : Benedict et al.

It is certified that error appears in the above-identified patent and that said Letters Patent is hereby corrected as shown below:

Column 13,
Line 15, please delete "mixing the"" and insert -- the mixing -- therein.

Column 14,
Line 25, please delete "is" and insert -- are -- therein.

Signed and Sealed this

Nineteenth Day of August, 2003

JAMES E. ROGAN
*Director of the United States Patent and Trademark Office*